(12) United States Patent
Zhu

(10) Patent No.: US 7,696,040 B2
(45) Date of Patent: Apr. 13, 2010

(54) METHOD FOR FABRICATION OF FIN MEMORY STRUCTURE

(75) Inventor: Huilong Zhu, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 330 days.

(21) Appl. No.: 11/755,246

(22) Filed: May 30, 2007

(65) Prior Publication Data
US 2008/0296648 A1 Dec. 4, 2008

(51) Int. Cl.
*H01L 21/8242* (2006.01)

(52) U.S. Cl. .............. 438/239; 257/E21.648; 257/E21.654; 438/210; 438/253

(58) Field of Classification Search .......... 257/E21.647, 257/E21.654, E21.646, E21.648; 438/210, 438/239, 241, 253
See application file for complete search history.

(56) References Cited

U.S. PATENT DOCUMENTS

| | | | |
|---|---|---|---|
| 6,207,985 B1 * | 3/2001 | Walker | 257/296 |
| 6,288,431 B1 * | 9/2001 | Iwasa et al. | 257/401 |
| 6,468,887 B2 * | 10/2002 | Iwasa et al. | 438/585 |
| 6,664,582 B2 | 12/2003 | Fried et al. | |
| 6,921,982 B2 | 7/2005 | Joshi et al. | |
| 7,074,660 B2 | 7/2006 | Manger | |
| 7,291,877 B2 * | 11/2007 | Brederlow et al. | 257/296 |
| 7,476,933 B2 * | 1/2009 | Juengling | 257/331 |
| 7,491,995 B2 * | 2/2009 | Forbes | 257/296 |
| 2005/0017377 A1 | 1/2005 | Joshi et al. | |
| 2005/0239242 A1 | 10/2005 | Zhu et al. | |
| 2006/0022248 A1 | 2/2006 | Fischer et al. | |
| 2007/0117311 A1 * | 5/2007 | Zaman | 438/253 |

* cited by examiner

*Primary Examiner*—Anh Phung
*Assistant Examiner*—Michael Lulis
(74) *Attorney, Agent, or Firm*—Scully, Scott, Murphy & Presser, P.C.; Ian D. MacKinnon, Esq.

(57) ABSTRACT

A semiconductor fin memory structure and a method for fabricating the semiconductor fin memory structure include a semiconductor fin-channel within a finFET structure that is contiguous with and thinner than a conductor fin-capacitor node within a fin-capacitor structure that is integrated with the finFET structure. A single semiconductor layer may be appropriately processed to provide the semiconductor fin-channel within the finFET structure that is contiguous with and thinner than the conductor fin-capacitor node within the fin-capacitor structure.

6 Claims, 9 Drawing Sheets

METHOD FOR FABRICATION OF FIN MEMORY STRUCTURE

BACKGROUND

1. Field of the Invention

The invention relates generally to semiconductor fin structures. More particularly, the invention relates to semiconductor fin structures with enhanced performance.

2. Description of the Related Art

Semiconductor circuits typically include both active semiconductor devices, such as but not limited to transistors and diodes, as well as passive devices, such as but not limited to resistors and capacitors. As semiconductor technology has advanced over several decades, both the active semiconductor devices and the passive devices have conventionally been scaled to increasingly smaller dimensions to reduce costs.

In an effort to provide for continued scaling of semiconductor structures to continuously smaller dimensions while maintaining or enhancing semiconductor device performance, the design and fabrication of semiconductor fin devices and semiconductor fin structures has recently evolved within the semiconductor fabrication art. Semiconductor fin devices and semiconductor fin structures, and in particular finFET devices and finFET structures, typically comprise vertical semiconductor channel structures that are fabricated using a semiconductor fin (i.e., including a vertical semiconductor surface rather than a planar semiconductor surface relative to a plane of a semiconductor substrate) as a channel region for the semiconductor fin devices and the semiconductor fin structures. Within the context of a finFET structure, a gate dielectric is located upon at least one vertical surface of the semiconductor fin. An inverted U shaped gate electrode is then located over the gate dielectric and the semiconductor fin. Since the sidewall surfaces, and sometimes also the top surface, of the semiconductor fin primarily comprise a channel region of the finFET structure, a finFET structure may in general may be scaled with increased channel dimensions in a vertical direction, to provide a constant or enhanced channel area of the finFET structure while decreasing an aerial surface area requirement of the finFET structure. finFET structures certainly provide advantages within semiconductor device fabrication and semiconductor structure fabrication since finFET structures allow for constant or increased channel region areas within finFET structures while using decreased semiconductor substrate areas when fabricating the finFET structures.

Various finFET structures having desirable properties, and methods for fabricating those finFET structures, are known in the semiconductor fabrication art.

For example, Fried et al., in U.S. Pat. No. 6,664,582, teaches a finFET structure integrated with a fin-capacitor structure to provide a semiconductor fin memory structure. By integrating the finFET structure with the fin-capacitor structure, the semiconductor fin memory structure may be fabricated with improved semiconductor fin memory structure density without overly increasing fabrication cost and complexity of the semiconductor fin memory structure.

In addition, Joshi et al., in U.S. Pub. No. 2005/0017377 and U.S. Pat. No. 6,921,982, teaches a semiconductor fin structure, such as a finFET structure, that includes a semiconductor fin that includes a semiconductor channel comprising a semiconductor channel core layer having a semiconductor channel envelope layer laminated thereto that has a different lattice structure than the semiconductor channel core layer. The different lattice structures for the semiconductor channel core layer and the semiconductor channel envelope layer provide a lattice mismatch therebetween that in turn introduces a strain into the semiconductor channel within the semiconductor fin structure.

Further, Zhu et al., in U.S. Pub. No. 2005/0239242, teaches a semiconductor fin structure, such as a finFET structure, that includes a plurality of stacked semiconductor fins. The plurality of stacked semiconductor fins within the semiconductor fin structure allows for improved circuit density while accommodating mobility differences within n-finFET and p-finFET devices that may be fabricated using the plurality of stacked semiconductor fins within the context of a single semiconductor substrate.

Still further, Fischer et al., in U.S. Pub. No. 2006/0022248, teaches a semiconductor fin structure, such as a finFET structure, having a gate that controls only a central region of a semiconductor fin within the semiconductor fin structure. Such gate control over only a limited portion of the semiconductor fin minimizes undesirable leakage paths within a semiconductor fin device that comprises the semiconductor fin structure.

Finally, Manger in U.S. Pat. No. 7,074,660, teaches a finFET structure, and a method for fabricating the finFET structure, that allows for an enhanced aerial density of a plurality of finFET devices within the finFET structure. The foregoing enhanced aerial density of the finFET devices within the finFET structure is provided by using a non-photolithographic method for fabricating a plurality of contacts within the plurality of finFET devices.

Semiconductor fin devices and structures, such as in particular finFET devices and structures, are certain to become increasingly prominent as semiconductor technology advances. Thus, desirable are semiconductor fin devices and structures having enhanced performance and enhanced functionality, and methods for fabrication thereof.

SUMMARY

The invention provides a semiconductor fin memory structure (i.e., a semiconductor fin memory device) and a method for fabricating the semiconductor fin memory structure. The semiconductor fin memory structure in accordance with the invention comprises a finFET structure integrated with a fin-capacitor structure. A semiconductor fin-channel within the finFET structure is contiguous with and thinner than a conductor fin-capacitor node within fin-capacitor structure. The thicker conductor fin-capacitor node within the fin-capacitor structure provides for a greater capacitance within the fin-capacitor structure and thus enhanced performance of the semiconductor fin memory structure.

A particular semiconductor fin memory structure in accordance with the invention includes a finFET structure integrated with a fin-capacitor structure to provide the semiconductor fin memory structure. A semiconductor fin-channel within the finFET structure is thinner than a conductor fin-capacitor node within the fin-capacitor structure.

A particular method for fabricating a semiconductor fin memory structure in accordance with the invention includes forming a finFET structure over a substrate. The particular method also includes forming a fin-capacitor structure over the substrate. A semiconductor fin-channel within the finFET structure is thinner than a conductor fin-capacitor node within the fin-capacitor structure.

Another particular method for fabricating a semiconductor fin memory structure in accordance with the invention includes providing a semiconductor layer located over a substrate. This other particular method also includes processing the semiconductor layer to provide a contiguous layer comprising a thinner semiconductor portion of the contiguous layer contiguous with a thicker conductor portion of the contiguous layer. This other particular method also includes patterning the contiguous layer to provide a patterned layer comprising a thinner semiconductor fin-channel portion contiguous with a thicker conductor fin-capacitor node portion. This other particular method also includes forming a finFET structure while using the thinner semiconductor fin-channel portion as a channel contiguous with a fin-capacitor structure that uses the thicker fin-capacitor node portion as a fin-capacitor node.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention, which includes a semiconductor fin memory structure and a method for fabricating the semiconductor fin memory structure, is understood within the context of the Description of the Preferred Embodiment, as set forth below. The Description of the Preferred Embodiment is understood within the context of the drawings described above. Since the drawings described above are intended for illustrative purposes, those drawings are not necessarily drawn to scale.

Figure 1:
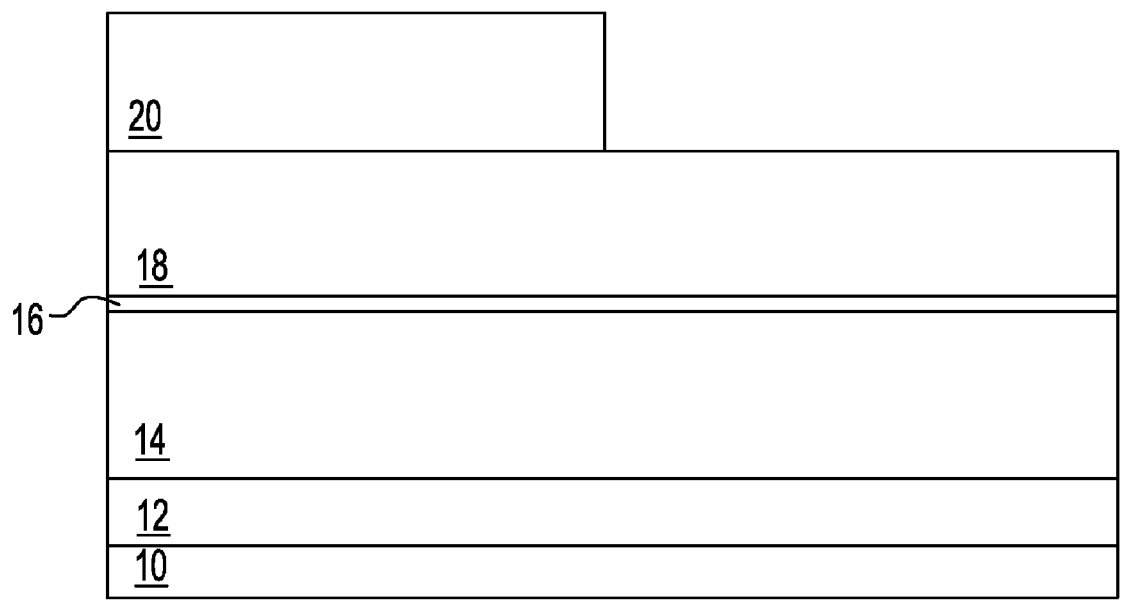
FIG. 1 to FIG. 9A show a series of schematic cross-sectional and plan-view diagrams illustrating the results of progressive stages in fabricating a semiconductor fin memory structure in accordance with a preferred embodiment of the invention.

FIG. 1 to FIG. 9A show a series of schematic cross-sectional and plan-view diagrams illustrating the results of progressive stages in fabricating a semiconductor fin memory structure in accordance with a particular embodiment of the invention. This particular embodiment of the invention comprises a preferred embodiment of the invention. FIG. 1 shows a schematic cross-sectional diagram of the semiconductor fin memory structure at an early stage in the fabrication thereof in accordance with this particular embodiment of the invention.

FIG. 1 shows a base semiconductor substrate 10. A buried dielectric layer 12 is located upon the base semiconductor substrate 10. A surface semiconductor layer 14 is located upon the buried dielectric layer 12. In an aggregate, the base semiconductor substrate 10, the buried dielectric layer 12 and the surface semiconductor layer 14 comprise a semiconductor-on-insulator substrate.

The base semiconductor substrate 10 may comprise any of several semiconductor materials. Non-limiting examples include silicon, germanium, silicon-germanium alloy, silicon-carbon alloy, silicon-germanium-carbon alloy and compound (i.e., III-V and II-VI) semiconductor materials. Non-limiting examples of compound semiconductor materials include gallium arsenide, indium arsenide and indium phosphide semiconductor materials. Typically, the base semiconductor substrate 10 has a generally conventional thickness.

The buried dielectric layer 12 may comprise any of several dielectric materials. Non-limiting examples include oxides, nitrides and oxynitrides, particularly of silicon, but oxides, nitrides and oxynitrides of other elements are not excluded. The buried dielectric layer 12 may comprise a crystalline or a non-crystalline dielectric material, with crystalline dielectric materials being highly preferred. The buried dielectric layer 12 may be formed using any of several methods. Non-limiting examples include ion implantation methods, thermal or plasma oxidation or nitridation methods, chemical vapor deposition methods and physical vapor deposition methods. Typically, the buried dielectric layer 12 comprises an oxide of the semiconductor material from which is comprised the semiconductor substrate 10. Typically, the buried dielectric layer 12 has a generally conventional thickness.

The surface semiconductor layer 14 may comprise any of the several semiconductor materials from which the base semiconductor substrate 10 may be comprised. The surface semiconductor layer 14 and the base semiconductor substrate 10 may comprise either identical or different semiconductor materials with respect to chemical composition, dopant polarity, dopant concentration and crystallographic orientation. Typically, the surface semiconductor layer 14 has a generally conventional thickness that may be in a range from about 300 to about 1500 angstroms.

The semiconductor-on-insulator substrate that is illustrated in FIG. 1 may be fabricated using any of several methods. Non-limiting examples include lamination methods, layer transfer methods and separation by implantation of oxygen (SIMOX) methods.

Although the embodiment illustrates the invention within the context of a semiconductor on-insulator substrate comprising the base semiconductor substrate 10, the buried dielectric layer 12 and the surface semiconductor layer 14, neither the embodiment nor the invention is intended to be so limited. Rather, the present invention may alternatively be practiced using a bulk semiconductor substrate (that would otherwise result from absence of the buried dielectric layer 12 under circumstances where the base semiconductor substrate 10 and the surface semiconductor layer 14 have identical chemical composition and crystallographic orientation). The embodiment also contemplates use of a hybrid orientation (HOT) substrate that has multiple semiconductor crystallographic orientations within a single semiconductor substrate.

FIG. 1 also shows (in cross-section) a pad dielectric layer 16 located upon the surface semiconductor layer 14, and a hard mask layer 18 located upon the pad dielectric layer 16. FIG. 1 finally shows a first photoresist layer 20 located upon the hard mask layer 18.

The pad dielectric layer 16 may comprise any of several pad dielectric materials that are generally conventional in the semiconductor fabrication art. Non-limiting examples of pad dielectric materials include oxides, nitrides and oxynitrides of silicon, although oxides, nitrides and oxynitrides of other elements are not excluded. Typically, the pad dielectric layer 16 comprises an oxide of the semiconductor material from which is comprised the surface semiconductor layer 14, which will typically comprise a silicon oxide pad dielectric material. The pad dielectric layer 16 may be formed at least in part using methods and materials analogous, equivalent or identical to the methods and materials that are used for forming the buried dielectric layer 12. Typically the pad dielectric layer 16 has a thickness from about 30 to about 150 angstroms.

The hard mask layer 18 may analogously with the pad dielectric layer 16 similarly also comprise any of several hard mask materials. Again, included in particular, but also not limiting, are oxides, nitrides and oxynitrides of silicon. Also again, included in particular, but also not excluded are oxides, nitrides and oxynitrides of other elements. The hard mask materials may be formed using methods and materials analogous, equivalent or identical to the methods and materials that are used for forming the buried dielectric layer 12. Typically, the hard mask layer 18 has a thickness from about 100 to about 500 angstroms. Typically, the hard mask layer 18 comprises a silicon nitride material and the pad dielectric layer 16 comprises a silicon oxide material.

The first photoresist layer 20 may comprise any of several photoresist materials. Non-limiting examples include positive photoresist materials, negative photoresist materials and hybrid photoresist materials. The first photoresist layer 20 may be formed using spin coating, photoexposure and development methods that are otherwise generally conventional in the semiconductor fabrication art. The first photoresist layer 20 typically comprises either a positive photoresist material or a negative photoresist material that has a generally conventional thickness.

Figure 2:
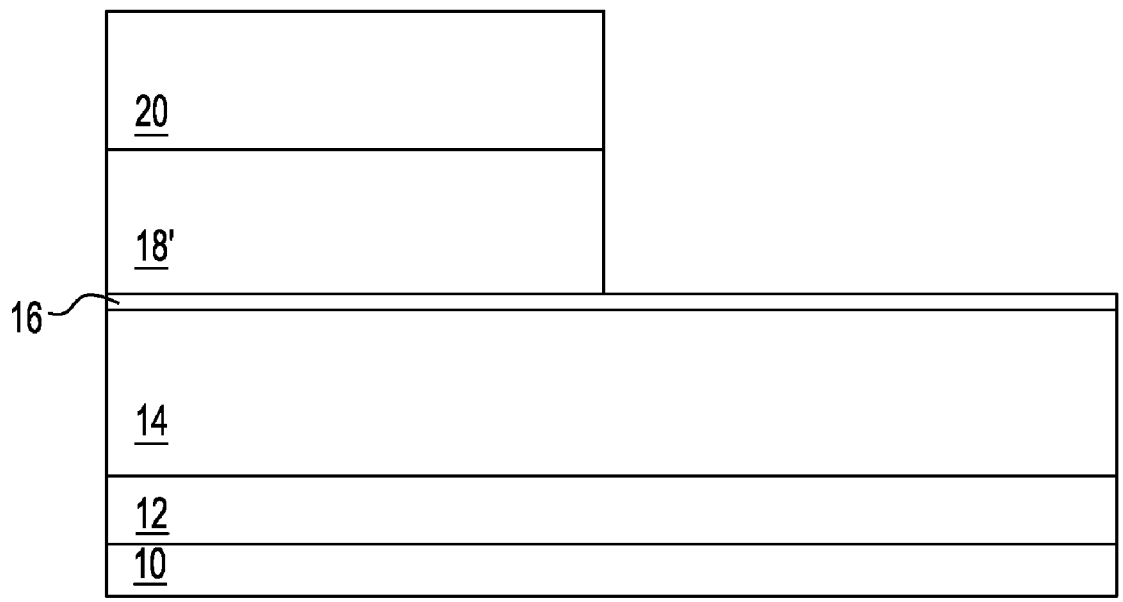

FIG. 2 shows a hard mask layer 18' that results from patterning of the hard mask layer 18 while using the photoresist layer 20 as an etch mask layer, and the pad dielectric layer 16 as an etch stop layer. The foregoing patterning is typically undertaken using a plasma etch method that is intended to provide straight or nearly straight sidewalls to the hard mask layer 18'. Under circumstances where the hard mask layer 18 comprises a hard mask material such as a silicon oxide, a silicon nitride or a silicon oxynitride hard mask material, the plasma etch method used for etching the hard mask layer 18 when forming the hard mask layer 18' may generally use a fluorine containing etchant gas composition.

Figure 3:
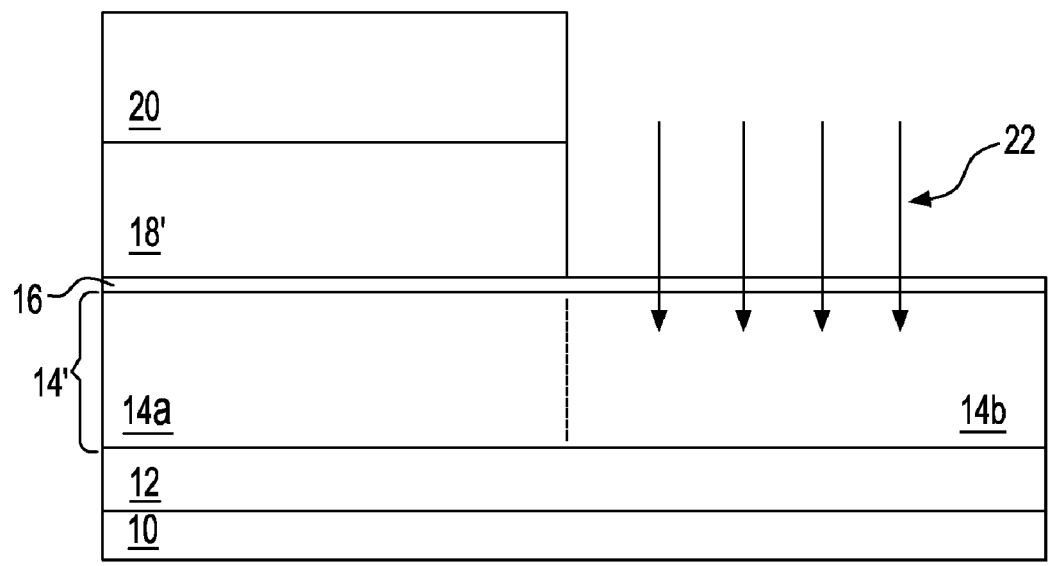

FIG. 3 shows a surface semiconductor layer 14' that results from implanting the surface semiconductor layer 14 while employing the first photoresist layer 20 and the hard mask layer 18' as an ion implantation mask, and an exposed portion of the pad dielectric layer 16 as a screen dielectric layer. In turn, the surface semiconductor layer 14' comprises a semiconductor fin-channel portion 14a contiguous with a conductor fin-capacitor node portion 14b. The foregoing ion implanting is undertaken using a dose of first implanting ions 22 as dopant implanting ions. The dose of first implanting ions 22 is selected of appropriate dopant polarity and composition for a polarity of a semiconductor fin memory structure to be fabricated incident to further processing of the semiconductor fin memory structure whose schematic cross-sectional diagram is illustrated in FIG. 3. The dose of first implanting ions 22 is provided at a dopant dose with respect to the conductor fin-capacitor node portion 14b of the surface semiconductor layer 14' from about $1\times10^{14}$ to about $5\times10^{15}$ dopant atoms per square centimeter. The remaining semiconductor fin-channel portion 14a of the surface semiconductor layer 14' covered by the first photoresist layer 20 typically receives only a very small dose, or no dose, from the dose of first implanting ions 22.

Figure 4:
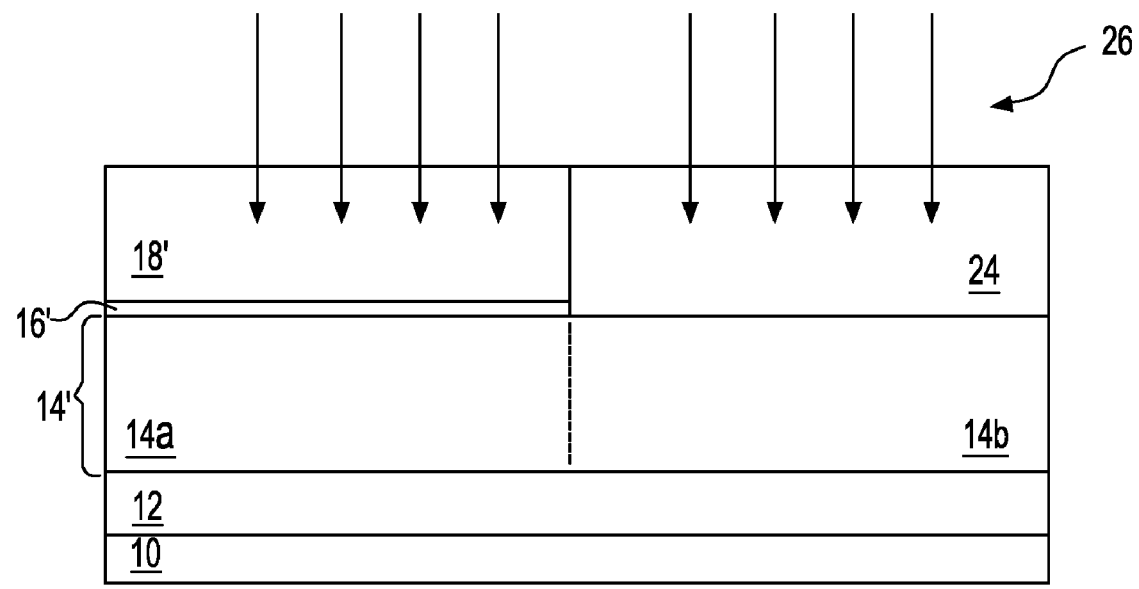

FIG. 4 first shows the results of stripping the first photoresist layer 20 from the semiconductor structure of FIG. 3. The first photoresist layer 20 may be stripped from the semiconductor structure of FIG. 3 to provide in part the semiconductor structure of FIG. 4 while using methods and materials that are otherwise generally conventional in the semiconductor fabrication art. Included in particular are wet chemical stripping methods, dry plasma stripping methods and aggregate stripping methods thereof.

FIG. 4 next shows a pad dielectric layer 16' that results from patterning of the pad dielectric layer 16 while using the hard mask layer 18' as an etch mask. The foregoing etching may be undertaken using methods and materials that are conventional in the semiconductor fabrication art. Included in particular are wet chemical etching methods, dry plasma stripping etching methods and aggregate etching methods thereof. Particularly common methods are dry plasma etching methods that use fluorine containing etchant gases, but the same by no means limit the embodiment or the invention.

FIG. 4 next shows a conductor fin-capacitor node auxiliary layer 24 located upon the conductor fin-capacitor node region 14b of the surface semiconductor layer 14' that is exposed after having stripped therefrom the portion of the pad dielectric layer 16 to provide the pad dielectric layer 16'. The conductor fin-capacitor node auxiliary layer 24 may comprise any of several conductor materials that have an adequate conductivity to provide a conductor fin-capacitor node structure. Such materials may include, but are not limited to certain metals, metal alloys, metal silicides, and metal nitrides, but will typically include a deposited polycrystalline conductor material (i.e., including silicon, germanium, silicon-germanium alloy and related carbon doped polycrystalline conductor materials), or as an alternative an epitaxially grown monocrystalline related conductor material within the context of the foregoing enumerated compositions. When using either the polycrystalline conductor material or the monocrystalline conductor material, a thickness of the resulting fin-capacitor node auxiliary layer 24 is formed to a nominal thickness of the pad dielectric layer 16' and the hard mask layer 18'. Together, the conductor fin-capacitor node region 14b of the surface semiconductor layer 14' and the fin-capacitor node auxiliary layer 24 have a thickness from about 600 to about 5000 angstroms.

FIG. 4 finally shows a dose of second implanting ions 26 that typically comprises a dopant of the same polarity, but not necessarily the same chemical composition, as the dose of first dopant ions 22 that is illustrated in FIG. 3. Thus, the dose of second dopant ions 26 is provided using ion implantation dose and energy conditions that provide the conductor fin-capacitor node auxiliary layer 24 and the conductor fin-capacitor node portion 14b of the surface semiconductor layer 14' of the same or similar conductivity.

Figure 5:
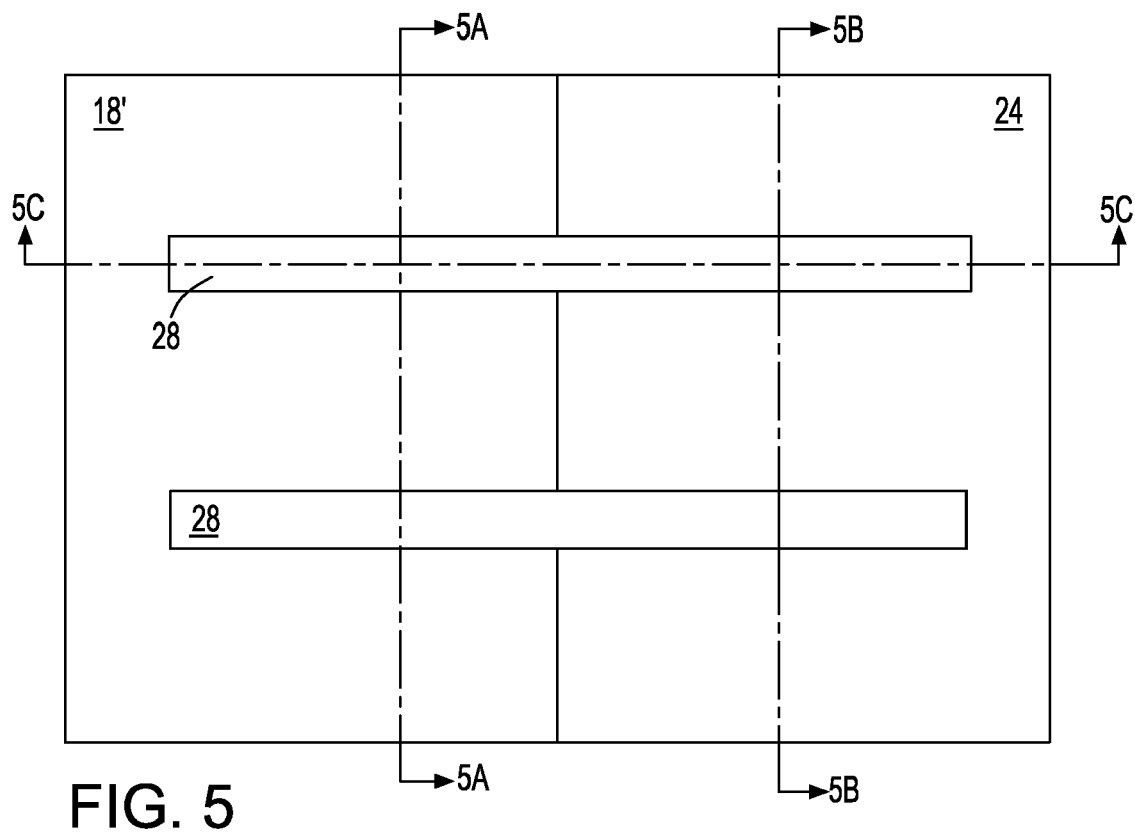

FIG. 5 shows a schematic plan-view diagram illustrating the results of further processing of the semiconductor fin memory structure whose schematic cross-sectional diagram is illustrated in FIG. 4.

FIG. 5 shows a plurality of second photoresist layers 28 located upon the semiconductor fin memory structure whose schematic cross-sectional diagram is illustrated in FIG. 4. Also shown in FIG. 5 is the hard mask layer 18' and the adjoining conductor fin-capacitor node auxiliary layer 24 upon which is located and formed the plurality of second photoresist layers 28. The plurality of second photoresist layers 28 may comprise photoresist materials, generally have dimensions, and also be formed using methods, that are otherwise generally conventional in the semiconductor fabrication art, and are also consistent with the materials, dimensions and methods that are used for forming the first photoresist layer 20 that is illustrated in FIG. 1.

Figure 5A:
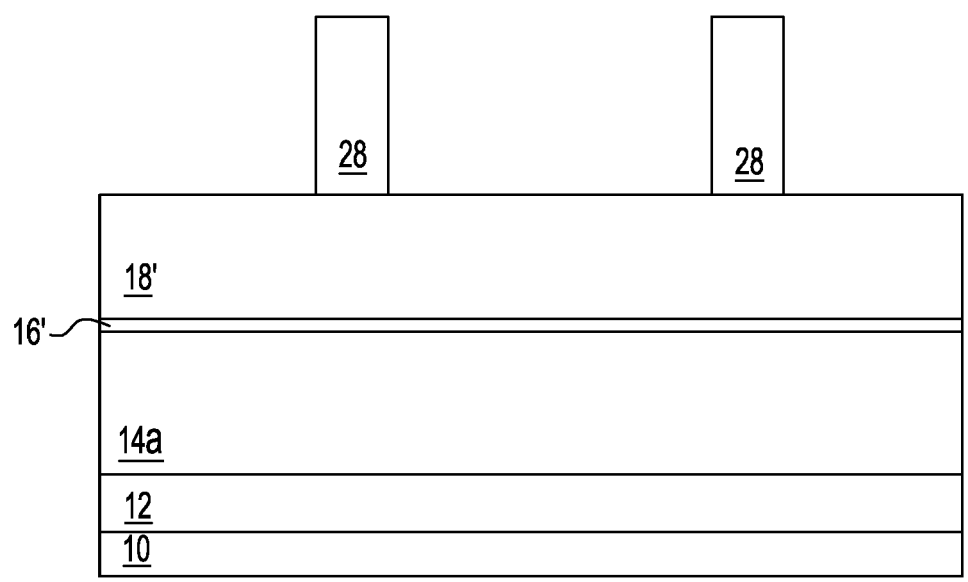
Figure 5B:
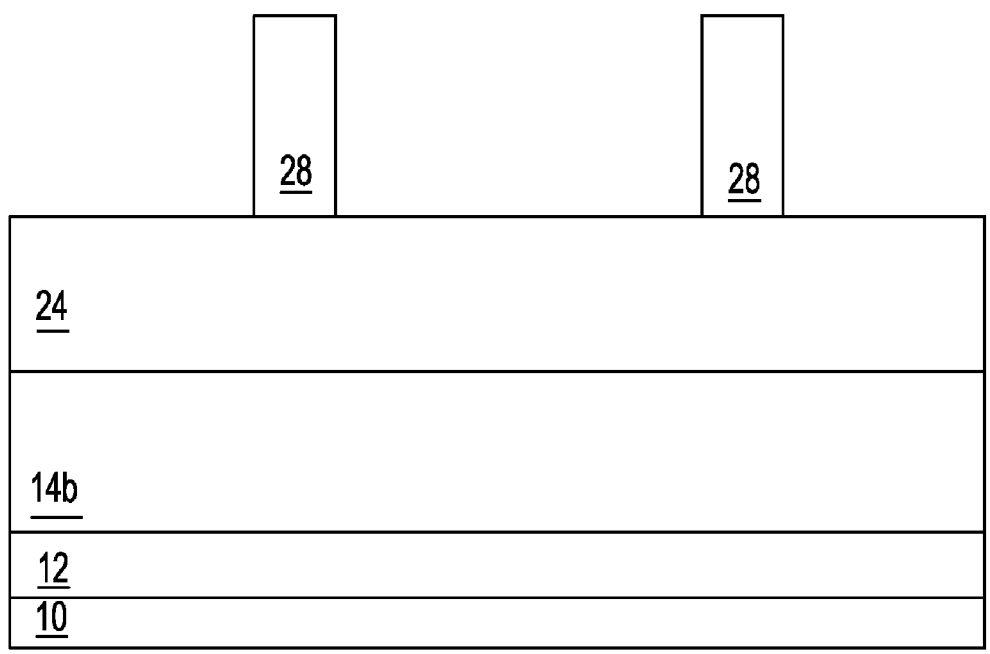
Figure 5C:
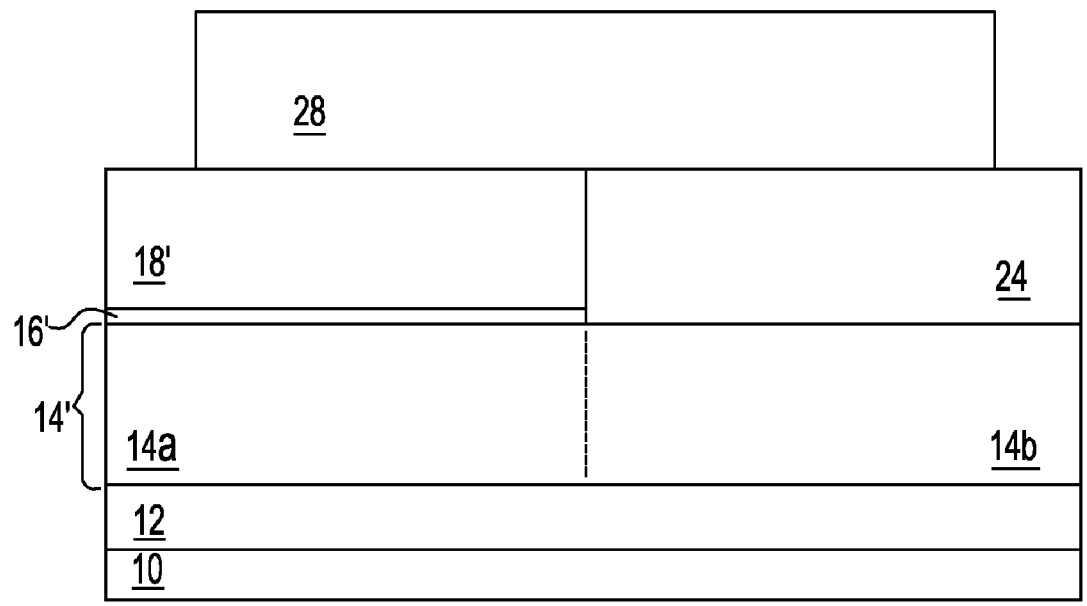

FIG. 5A, FIG. 5B and FIG. 5C show schematic cross-sectional diagrams that correspond with the schematic plan-view diagram of FIG. 5. Like layers and structures within the schematic cross-sectional diagrams of FIG. 5A, FIG. 5B and FIG. 5C are identically numbered with FIG. 4 and FIG. 5.

Figure 6A:
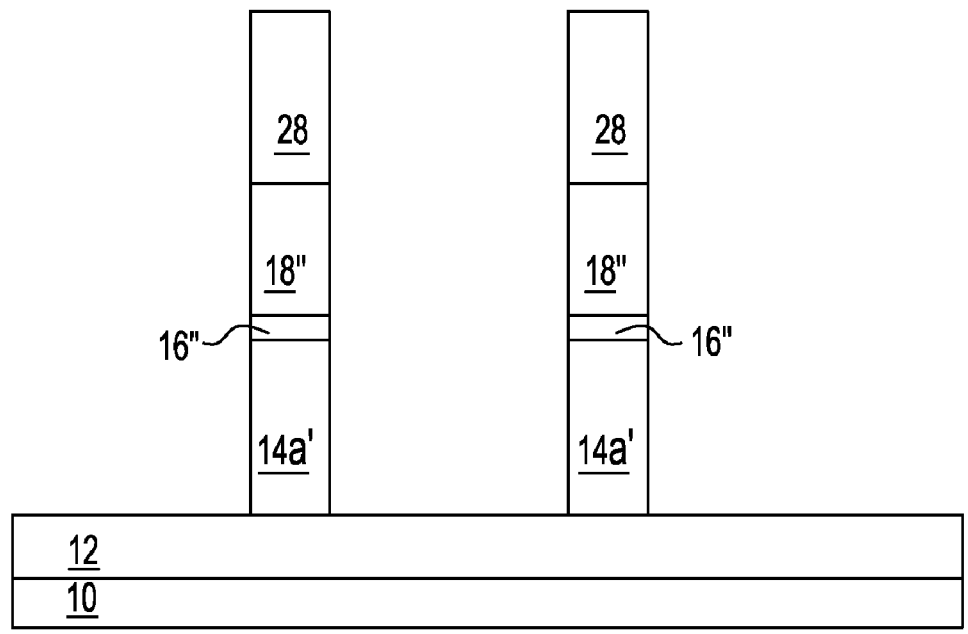
Figure 6B:
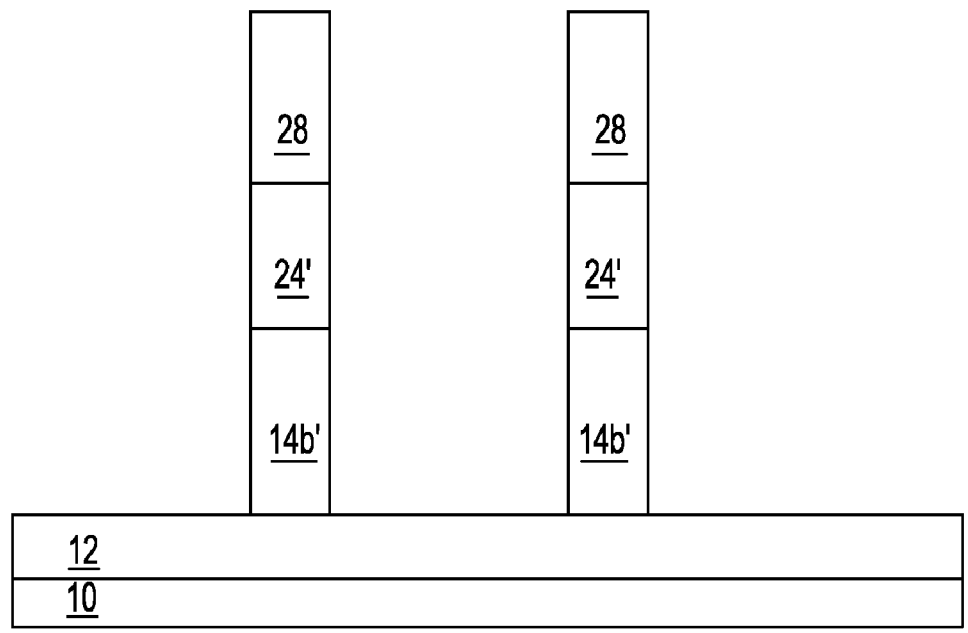
Figure 6C:
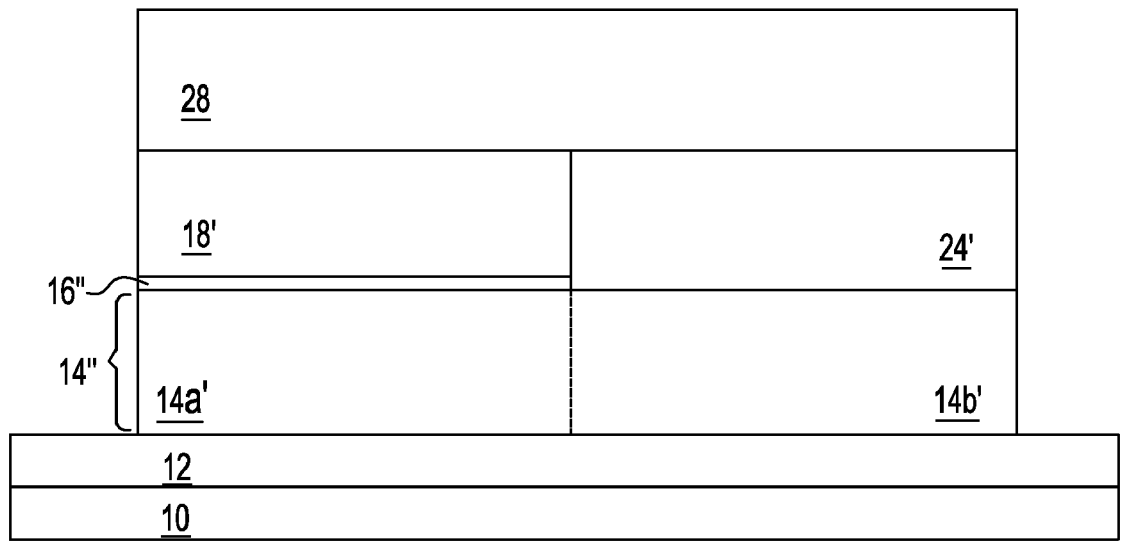

FIG. 6A, FIG. 6B and FIG. 6C correspond with FIG. 5A, FIG. 5B and FIG. 5C, and more particularly illustrate the results of patterning the hard mask layer 18', the pad dielectric layer 16', the surface semiconductor layer 14' and the conductor fin-capacitor node auxiliary layer 24 while using the second photoresist layers 28 as a mask. As a result of the foregoing patterning, a surface semiconductor layer 14" (i.e., comprising a semiconductor fin-channel portion 14a' and a conductor fin-capacitor node portion 14b'), a pad dielectric layer 16", a hard mask layer 18" and a conductor fin-capacitor node auxiliary layer 24' are formed. The foregoing etching is typically undertaken using a plasma etch method that uses an etchant gas composition, or a plurality of etchant gas compositions, that is appropriate to the materials from which are comprised the surface semiconductor layer 14', the pad dielectric layer 16', the hard mask layer 18' and the conductor fin-capacitor node auxiliary layer 24. Typically such an etchant gas composition may comprise a halogen containing etchant gas, such as but not limited to a fluorine containing etchant gas.

Figure 7A:
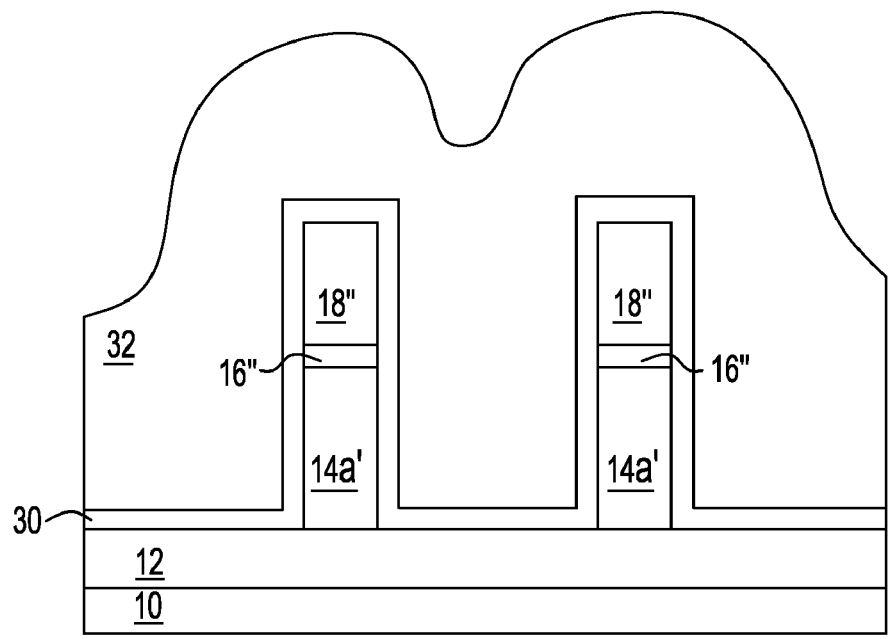
Figure 7B:
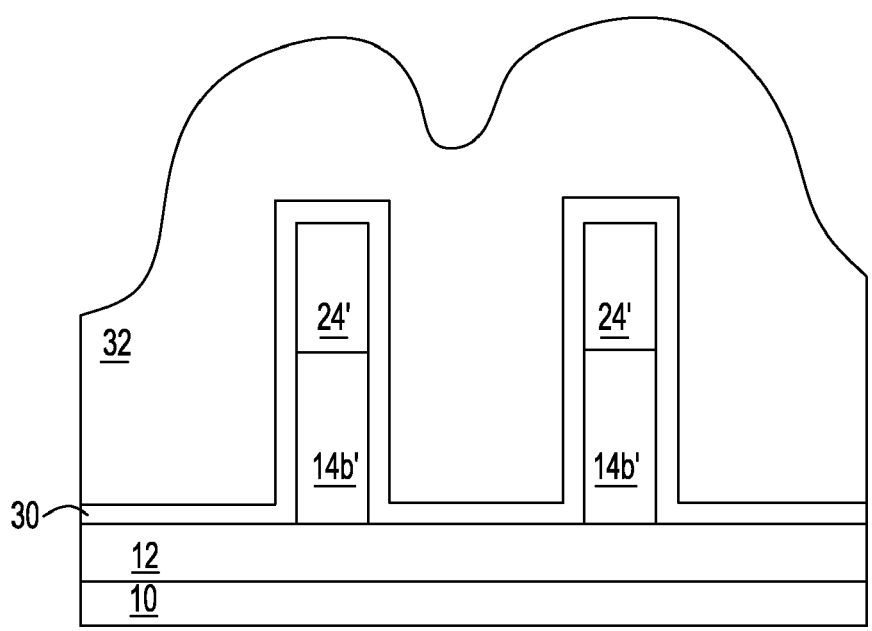

FIG. 7A and FIG. 7B correspond generally with FIG. 6A and FIG. 6B, but first with a stripping of the second photoresist layers 28 from the hard mask layers 18" or the conductor fin-capacitor node auxiliary layers 24'.

Subsequent to stripping the photoresist layers 28 from the hard mask layers 18" or the fin-capacitor node auxiliary layers 24', a gate and capacitor dielectric 30 is formed and located upon exposed portions of the buried oxide layer 12, the surface semiconductor layers 14" (including the semiconductor fin-channel portions 14a' and the conductor fin-capacitor node portions 14b'), the pad dielectric layers 16", the hard mask layers 18", and the conductor fin-capacitor node auxiliary layers 24'. FIG. 7A and FIG. 7B also show a gate electrode and capacitor plate material layer 32 located upon the gate and capacitor dielectric 30.

The gate and capacitor dielectric 30 may comprise conventional dielectric materials such as oxides, nitrides, and oxynitrides of silicon that have a dielectric constant from about 4 to about 20, measured in vacuum. Alternatively, the gate and capacitor dielectric 30 may comprise generally higher dielectric constant gate and capacitor dielectric materials having a dielectric constant from about 20 to at least about 100. Such higher dielectric constant gate and capacitor dielectric materials may include, but are not limited to hafnium oxides, hafnium silicates, titanium oxides, barium-strontium-titantates (BSTs) and lead-zirconate-titanates (PZTs). The gate and capacitor dielectric 30 may be formed using any of several methods that are appropriate to its material(s) of composition. Included, but not limiting are: thermal or plasma oxidation or nitridation methods, chemical vapor deposition methods physical vapor deposition methods and atomic layer deposition. FIG. 7A in particular implicitly illustrates the gate and capacitor dielectric 30 as comprising a deposited gate dielectric material. Although such processing is not necessarily a requirement of the embodiment of the invention, typically, the gate and capacitor dielectric 30 may comprise a generally higher dielectric constant deposited dielectric material in accordance with disclosure above.

The gate electrode and capacitor plate material layer 32 may comprise gate electrode and capacitor plate materials including, but not limited to certain metals, metal alloys, metal nitrides and metal silicides, as well as laminates thereof and composites thereof. The gate electrode and capacitor plate material layer 32 may also comprise doped polysilicon and silicon-germanium alloy materials (i.e., having a dopant concentration from about 1e18 to about 1e22 dopant atoms per cubic centimeter and also including related carbon doped materials) and polycide materials (related doped polysilicon containing/metal silicide stack materials). Similarly, the foregoing materials may also be formed using any of several methods. Non-limiting examples include salicide methods, chemical vapor deposition methods and physical vapor deposition methods, such as, but not limited to evaporative methods and sputtering methods. Typically, the gate electrode and capacitor plate material layer 32 comprises a doped polysilicon material that has a generally conventional thickness in a range from about 600 to about 2000 angstroms.

Figure 8:
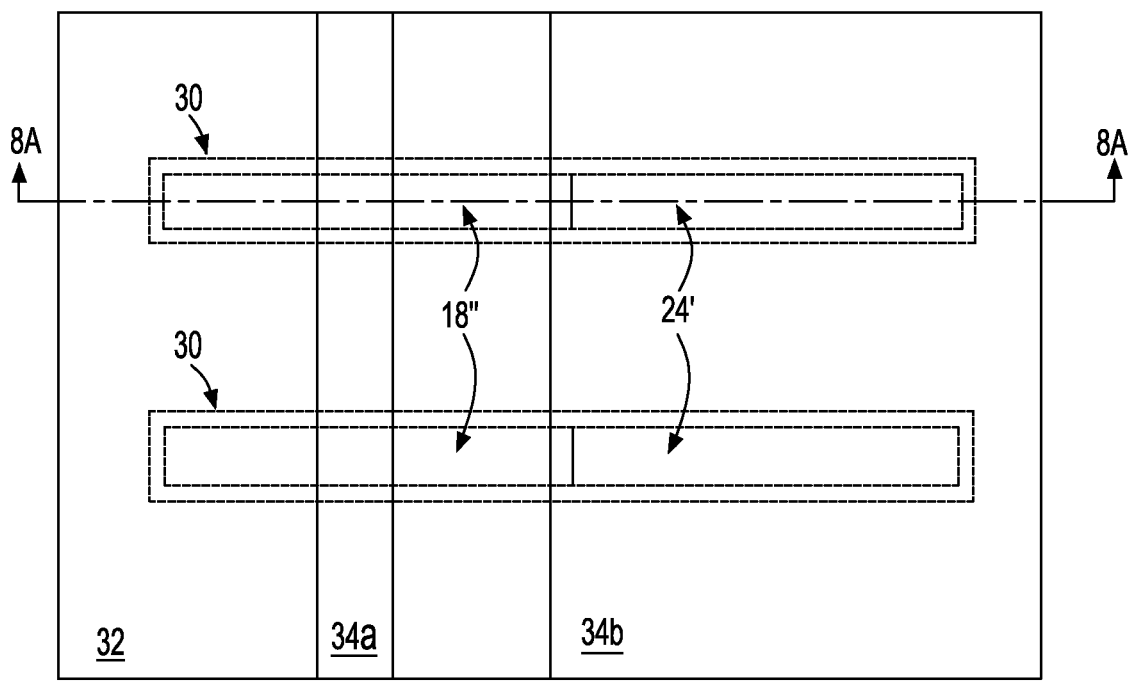

FIG. 8 shows a plurality of third photoresist layers 34a and 34b located upon the gate electrode and capacitor plate material layer 32. Also illustrated within the schematic plan-view diagram of FIG. 8 are the hard mask layers 18"', the conductor fin-capacitor node auxiliary layers 24' and the gate and capacitor dielectric 30. The plurality of third photoresist layers 34a and 34b may comprise photoresist materials, have dimensions and be formed using methods analogous, equivalent or identical to the materials, dimensions and methods that are used within the context of the second photoresist layers 28 that are illustrated in FIGS. 5, 5A, 5B and 5C, and the first photoresist layer 20 that is illustrated in FIG. 1.

Figure 8A:
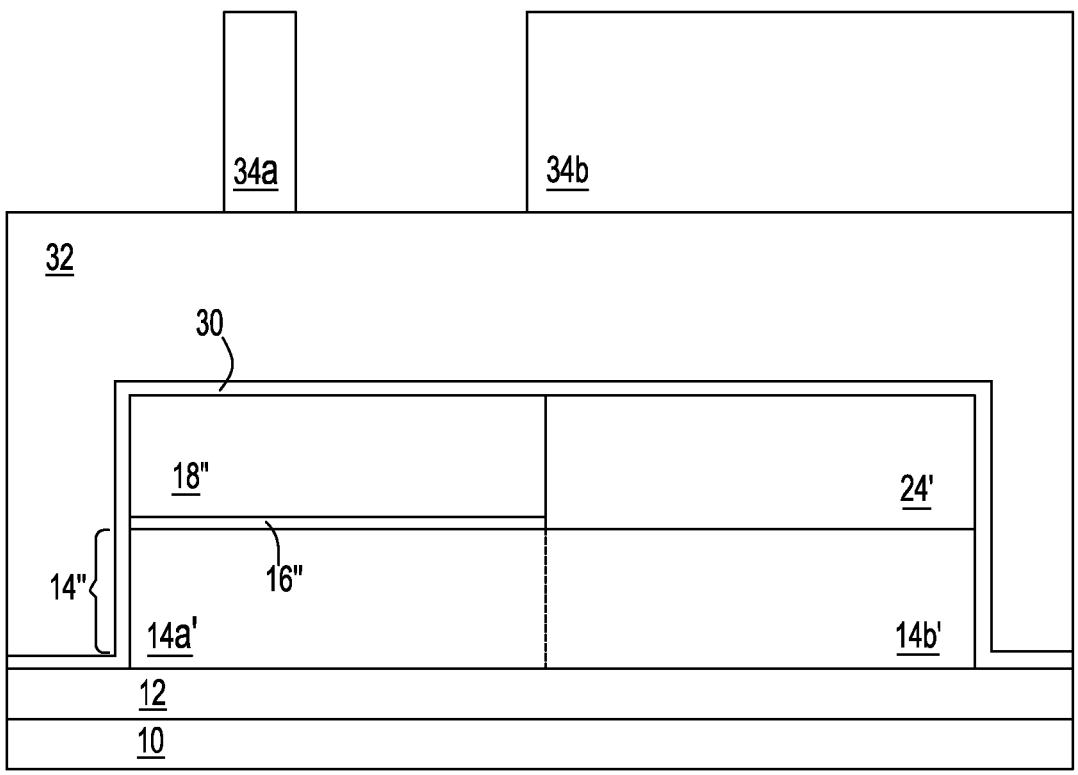

FIG. 8A shows a schematic cross-sectional diagram that corresponds with the semiconductor fin memory structure whose schematic plan-view diagram is illustrated in FIG. 8.

Figure 9:
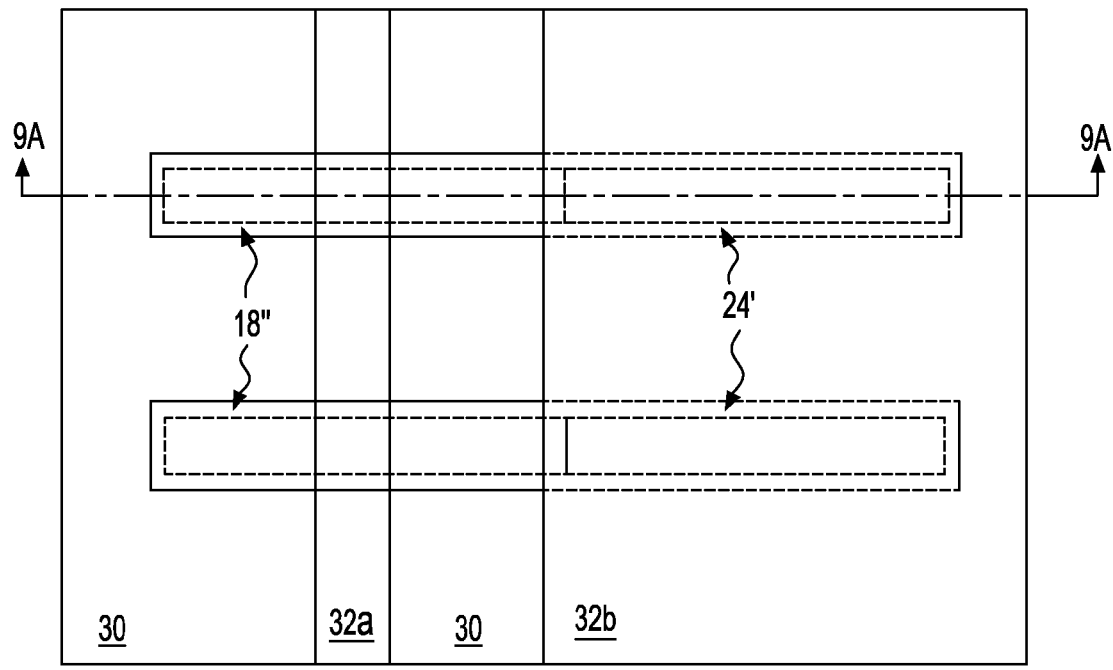

FIG. 9 shows a schematic plan-view diagram that first illustrates the results of etching the gate electrode and capacitor plate material layer 32 to form a gate electrode 32a and a capacitor plate 32b. Subsequent to the foregoing etching, the photoresist layers 34a and 34b are stripped from the corresponding gate electrode 32a and the corresponding capacitor plate layer 32b to provide the semiconductor fin memory structure that is illustrated in FIG. 9.

The foregoing etching may be affected using methods and materials that are otherwise generally conventional in the semiconductor fabrication art. Included in particular are dry plasma etch methods that use appropriate etchant gas compositions, such as but not limited to chlorine containing etchant gas compositions.

Figure 9A:
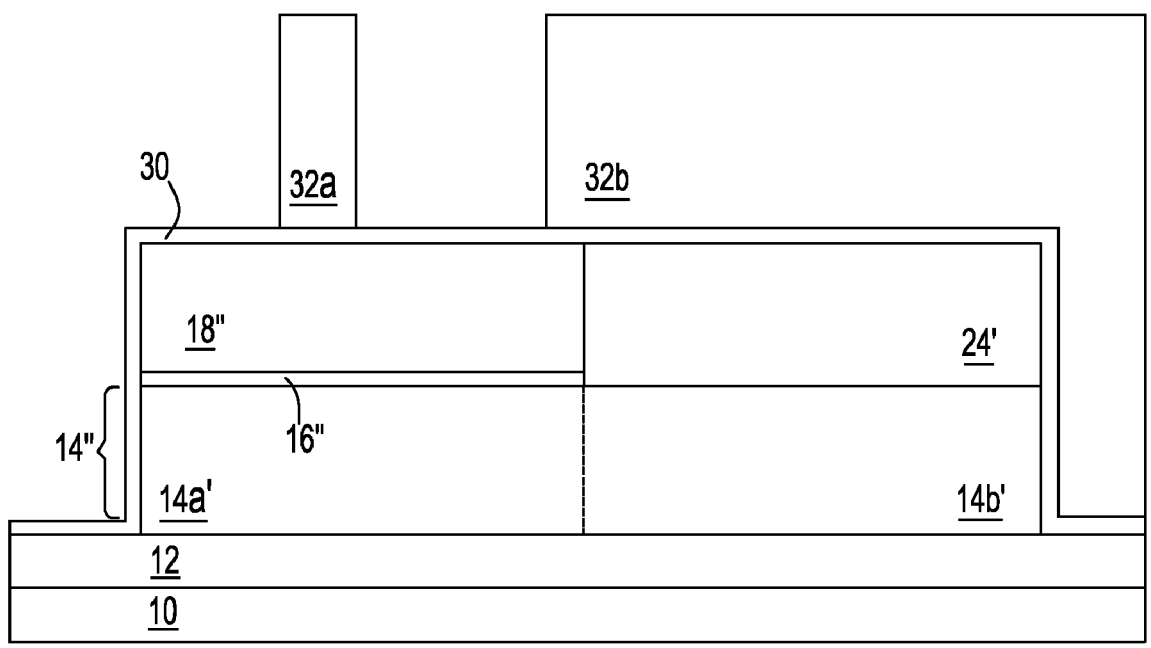

FIG. 9A shows a schematic cross-sectional diagram that corresponds with the semiconductor fin memory structure whose schematic plan-view diagram is illustrated in FIG. 9.

FIG. 9A shows a schematic cross-sectional diagram of a semiconductor fin memory structure in accordance with a preferred embodiment of the invention. The semiconductor fin memory structure includes a finFET portion that includes the semiconductor fin-channel portion 14a' of the surface semiconductor layer 14" over which is located the gate electrode 32a. The semiconductor fin memory structure in accordance with the schematic cross-sectional diagram of FIG. 9A also includes a fin-capacitor structure contiguous with the finFET structure. The fin-capacitor structure includes the conductor fin-capacitor node portion 14b' of the semiconductor surface layer 14" that is contiguous with the semiconductor fin-channel portion 14a' of the surface semiconductor layer 14". Laminated to the conductor fin-capacitor node portion 14b' of the surface semiconductor layer 14" is the conductor fin-capacitor node auxiliary layer 24'. A gate and capacitor dielectric 30 separates the conductor fin-capacitor node portion 14b of the surface semiconductor layer 14" and the conductor fin-capacitor node auxiliary layer 24' laminated thereupon from the capacitor plate 32b. A semiconductor fin memory structure in accordance with the invention may comprise either an n or a p semiconductor fin memory structure predicated upon a corresponding polarity of a finFET device fabricated within the semiconductor fin memory structure.

The semiconductor fin memory structure in accordance with FIG. 9A provides advantage insofar as a height of a semiconductor fin-capacitor node that includes the conductor fin-capacitor node portion 14b' of the surface semiconductor layer 14" and the conductor fin-capacitor node auxiliary layer 24' is higher than a semiconductor fin-channel portion 14a' of the surface semiconductor layer 14" (i.e., a semiconductor fin-channel within the finFET structure is thinner than a conductor fin-capacitor node within the fin-capacitor structure). This additional height that is provided by the conductor fin-capacitor node auxiliary layer 24' provides for a greater capacitance within the fin-capacitor portion of the semiconductor fin memory structure whose schematic cross-sectional diagram is illustrated in FIG. 9A, and thus enhanced performance of the semiconductor fin memory structure.

The preferred embodiment is illustrative of the invention rather than limiting of the invention. Revisions and modifications may be made to methods, materials, structures and dimension of a semiconductor fin memory structure in accordance with the preferred embodiment of the invention, while still providing a semiconductor fin memory structure in accordance with the invention, further in accordance with the accompanying claims.

What is claimed is:

1. A method for fabricating a semiconductor structure comprising:
    forming a hard mask over a portion of semiconductor surface of a substrate;
    implanting an exposed portion of the semiconductor surface to provide a doped semiconductor surface;
    forming a semiconductor layer over the doped semiconductor surface, in which an upper surface of the semiconductor layer is substantially coplanar with the upper surface of the hard mask;
    patterning the semiconductor layer and the doped semiconductor surface to provide a storage node having a first height and patterning the hard mask and the semiconductor surface that is underlying the hard mask to provide a finFET structure having a second height, wherein the first height is greater than the second height, wherein the hard mask of the finFET structure is in direct contract with the semiconductor layer of the storage node and the doped semiconductor surface of the storage node is in direct contact with the semiconductor surface of the finFET structure that is underlying the hard mask;
    forming a dielectric layer over the storage node and the finFET structure; and
    forming a gate structure on the dielectric layer that is on the finFET structure and a capacitor plate on the dielectric layer that is on the storage node.

2. The method of claim 1 wherein the semiconductor layer is a monocrystalline conductor material that is formed upon a doped semiconductor surface comprised of a monocrystalline conductor material.

3. The method of claim 1 wherein the semiconductor layer is a polycrystalline conductor material that is formed upon a doped semiconductor surface comprised of a monocrystalline conductor material.

4. The method of claim 1 wherein the implanting of the exposed portion of the semiconductor surface to provide the doped semiconductor surface is an ion implantation method.

5. The method of claim 1 wherein the forming the finFET structure comprises forming an n finFET structure.

6. The method of claim 1 wherein the forming the finFET structure comprises forming a p finFET structure.

* * * * *